United States Patent
Sun et al.

(10) Patent No.: US 9,499,664 B2
(45) Date of Patent: Nov. 22, 2016

(54) POLYIMIDE POLYMER, POLYIMIDE FILM HAVING THE SAME AND POLYIMIDE LAMINATE HAVING THE SAME

(71) Applicant: MORTECH CORPORATION, Taoyuan (TW)

(72) Inventors: Der-Jen Sun, Taoyuan (TW); Chi-Sheng Chen, Taoyuan (TW); Kuo-Wei Li, Taoyuan (TW); Yen-Huey Hsu, Taoyuan (TW)

(73) Assignee: MORTECH CORPORATION, Taoyuan (TW)

( * ) Notice: Subject to any disclaimer, the term of this patent is extended or adjusted under 35 U.S.C. 154(b) by 44 days.

(21) Appl. No.: 14/615,286

(22) Filed: Feb. 5, 2015

(65) Prior Publication Data

US 2016/0122483 A1  May 5, 2016

(30) Foreign Application Priority Data

Oct. 29, 2014 (TW) ............................. 103137496 A

(51) Int. Cl.
*C08L 79/08* (2006.01)
*C08G 69/32* (2006.01)
*C09D 179/08* (2006.01)

(52) U.S. Cl.
CPC ............. *C08G 69/32* (2013.01); *C09D 179/08* (2013.01); *C08L 79/08* (2013.01)

(58) Field of Classification Search
CPC ....................................................... C08L 79/08
See application file for complete search history.

(56) References Cited

U.S. PATENT DOCUMENTS

| | | | | |
|---|---|---|---|---|
| 4,912,197 | A * | 3/1990 | Hayes | B01D 71/64 528/125 |
| 7,550,194 | B2 | 6/2009 | Simone et al. | |
| 8,461,257 | B2 | 6/2013 | Huang et al. | |
| 2006/0124693 | A1* | 6/2006 | Meloni | B32B 15/08 228/56.3 |
| 2009/0226642 | A1* | 9/2009 | Simone | C08G 73/1039 428/1.33 |

FOREIGN PATENT DOCUMENTS

EP  1 749 850 A1  2/2007

* cited by examiner

*Primary Examiner* — Michael Pepitone
(74) *Attorney, Agent, or Firm* — Maschoff Brennan

(57) ABSTRACT

A polyimide polymer, polyimide film and polyimide laminate plate including the same are provided. The polyimide polymer includes Formula (I), Formula (II) and Formula (III).

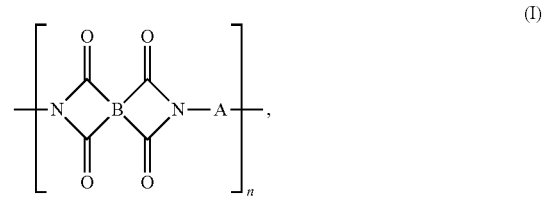

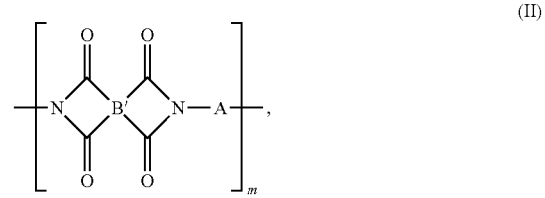

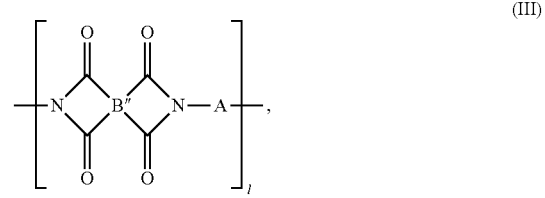

In Formula (I), Formula (II) and Formula (III), A is an aromatic group with fluorine, B, B', and B" are aromatic groups different from one another. B/(B+B'+B"), B'/(B+B'+B"), and B"/(B+B'+B") are larger than 0. The polyimide film includes a film layer which includes the above polyimide polymer. The film layer optionally includes colorants or inorganic nanoparticles. Therefore, the thermal resistance and the transparency of the polyimide film are improved, and a polyimide film with high thermal resistance and different colors is available. The polyimide solution can also be applied on metal film to form polyimide laminate plate.

17 Claims, No Drawings

POLYIMIDE POLYMER, POLYIMIDE FILM HAVING THE SAME AND POLYIMIDE LAMINATE HAVING THE SAME

CROSS-REFERENCE TO RELATED APPLICATIONS

This non-provisional application claims priority under 35 U.S.C. §119(a) on Patent Application No(s). 103137496 filed in Taiwan, R.O.C. on Oct. 29, 2014, the entire contents of which are hereby incorporated by reference.

TECHNICAL FIELD

The disclosure relates to a polyimide polymer, a polyimide film having the same and a polyimide laminate plate having the same, and more particularly to a polyimide polymer with high transparency, high heat resistance and good flexibility, a polyimide film having the same and a polyimide laminate plate having the same.

BACKGROUND

With the development of technology, traditional display devices and touch panels could not meet requirements of consumers. Therefore, flexible electronic products are developed. Firstly, a basic requirement for materials of display panels and touch panels is that the material has good optical transmittance, which makes contents displayed on the electronic products clear to users. As a result, a flexible transparent substrate is required to have optical transmittance over 80% in visible range.

Secondly, because the traditional display devices and the touch panels are not flexible, glass substrates are good enough to meet the requirement of optical transmittance. However, the glass substrate is thick, heavy and fragile so that another kind of substrate is developed to replace the glass substrate for being flexible and thinner. In addition, flexible electronic products require flexible transparent substrates. Plastic substrates which are flexible and have high transmittance are in the limelight in the field.

In addition, since a conducting layer need to be set on transparent plastic substrates so that the transparent plastic substrates need to endure the change of temperature during a manufacturing process of semiconductors of the display panels and the touch panels. To meet this requirement, the transparent plastic substrates are designed to have good heat endurance. Generally speaking, the transparent plastic substrates must endure the temperature above 250° C. such that there is no damage on the transparent plastic substrates during the process.

Polyimide thin film has good characteristics of flexibility, lightness, heat endurance and is widely used in semiconductor products. However, owing to the charge transfer complex effect of polyimide thin film, the color of the polyimide becomes yellow or red-brown. The color transition is unfavorable to the substrate of the display panels and touch panels.

However, when the polyimide thin film are utilized in the flexible display panels and touch panels of flexible electronic products, polyimide thin film has a trilemma that good optical transmittance, flexibility and heat endurance cannot maintain at the same time. Thus, manufactures try to develop the polyimide to have good transmittance, good flexibility and high heat endurance at the same time.

SUMMARY

An embodiment of the disclosure provides a polyimide polymer. The polyimide polymer comprises a first repeat unit represented by formula (I), a second repeat unit represented by formula (II) and a third repeat unit represented by formula (III). In formula (I), (II) and (III), A is aromatic group with fluorine, and B, B' and B" are aromatic groups different from one another. The polyimide polymer satisfies following conditions: $B/(B+B'+B")>0$, $B'/(B+B'+B")>0$, and $B"/(B+B'+B")>0$.

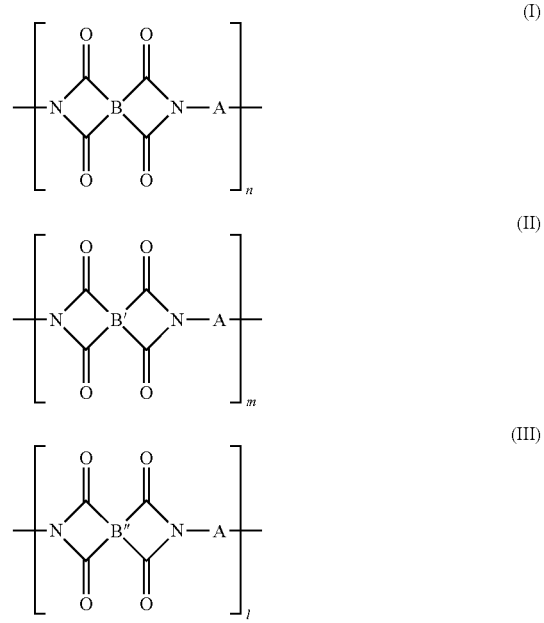

An embodiment of the disclosure provides a polyimide film. The polyimide film comprises a thin film layer. The thin film layer comprises a polyimide polymer. The polyimide polymer comprises a first repeat unit represented by formula (I), a second repeat unit represented by formula (II) and a third repeat unit represented by formula (III). In formula (I), (II) and (III), A is aromatic group with fluorine, and B, B' and B" are aromatic groups different from one another. The polyimide polymer satisfies following conditions: $B/(B+B'+B")>0$, $B'/(B+B'+B")>0$, and $B"/(B+B'+B")>0$.

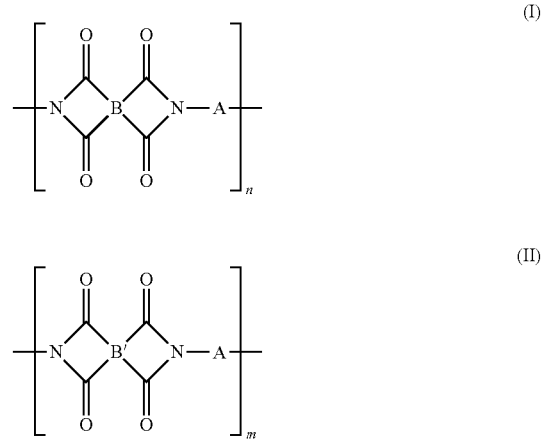

-continued

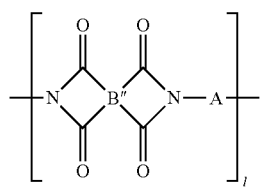
(III)

An embodiment of the disclosure provides a polyimide laminate plate. The polyimide laminate plate comprises a thin film layer. The thin film layer comprises a polyimide polymer. The polyimide polymer comprises a first repeat unit represented by formula (I), a second repeat unit represented by formula (II) and a third repeat unit represented by formula (III). In formula (I), (II) and (III), A is aromatic group with fluorine, and B, B' and B" are aromatic groups different from one another. The polyimide polymer satisfies following conditions: B/(B+B'+B")>0, B'/(B+B'+B")>0, and B"/(B+B'+B")>0.

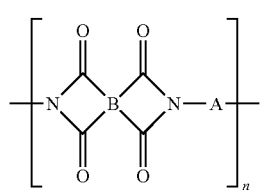
(I)

(II)

(III)

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A first embodiment of the disclosure provides a polyimide polymer. The polyimide polymer comprises a first repeat unit represented by formula (I), a second repeat unit represented by formula (II) and a third repeat unit represented by formula (III).

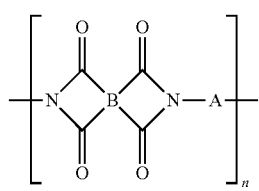
(I)

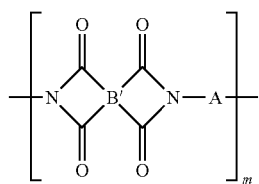
(II)

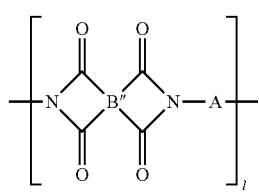
(III)

A is an aromatic group with fluorine selected from the group consisting of

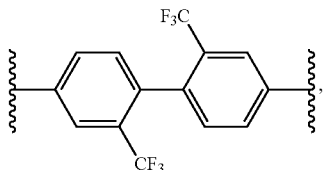

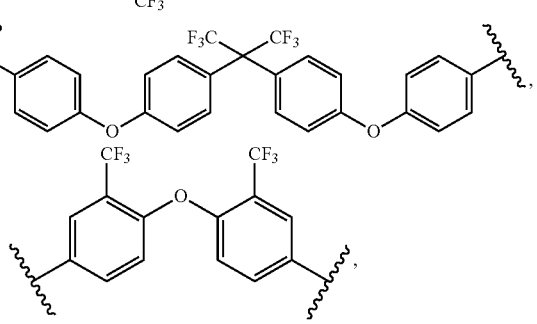

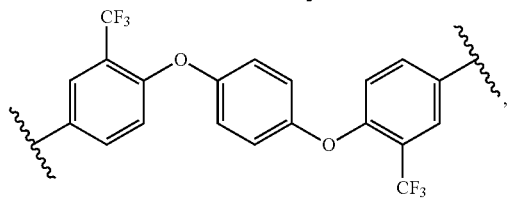

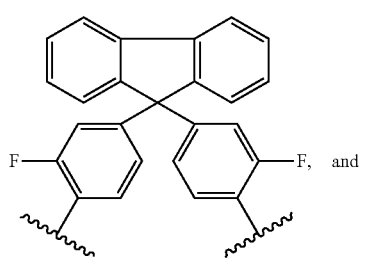
, and

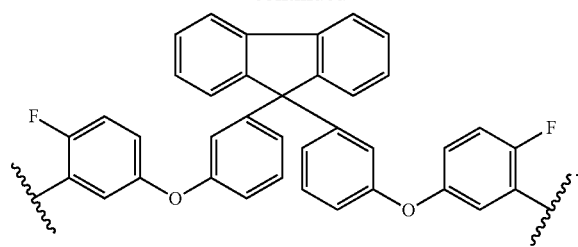
B, B' and B" are aromatic groups different from one another. B, B' and B" are selected from the group consisting of
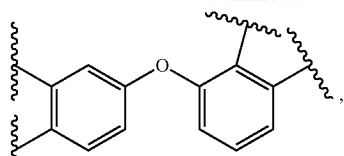
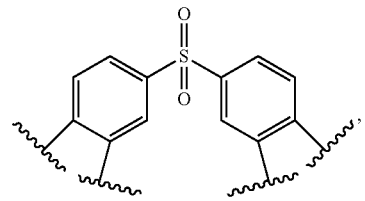
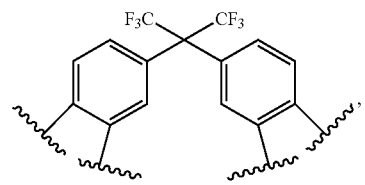
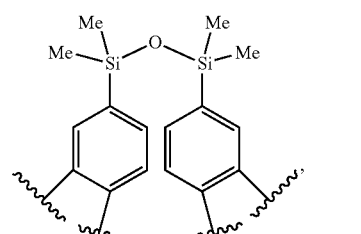
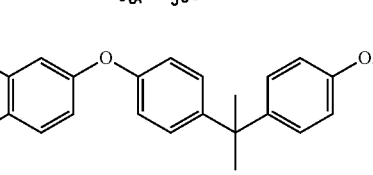
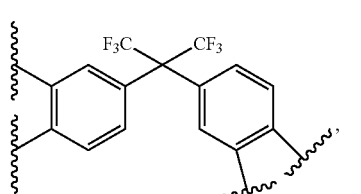
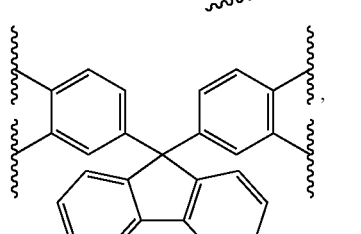
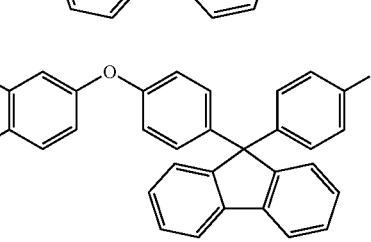

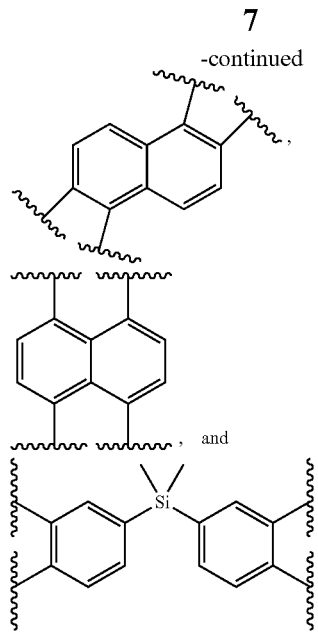

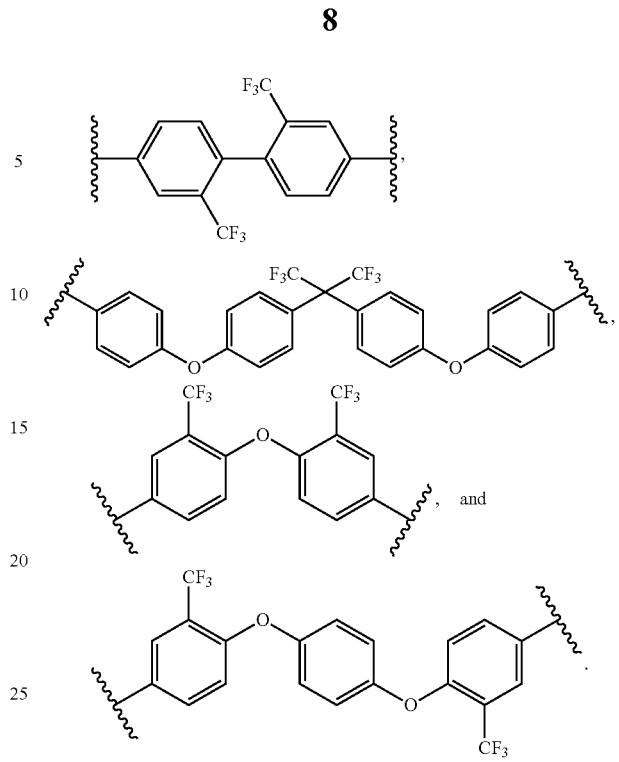

The polyimide polymer satisfies following conditions:
B/(B+B'+B")>0,
B'/(B+B'+B")>0, and
B"/(B+B'+B")>0.

A second embodiment of the disclosure provides a polyimide polymer. The polyimide polymer comprises a first repeat unit represented by formula (I), a second repeat unit represented by formula (II) and a third repeat unit represented by formula (III).

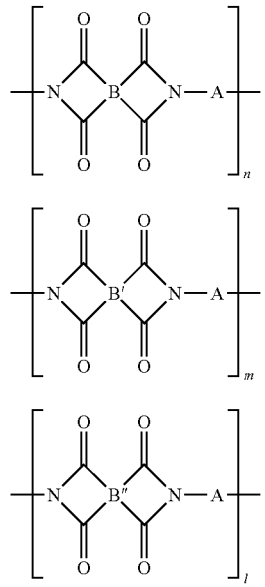

A is an aromatic group with fluorine. A comprises A' and A". A' is aromatic group with fluorine but without fluorenyl group, and A" is an aromatic group with fluorine and fluorenyl group. A ratio of A':A" is between 1:1 and 9:1.

A' is an aromatic group with fluorine but without fluorenyl group. The aromatic group with fluorine but without fluorenyl group is selected from the group consisting of A" is an aromatic group with fluorine and fluorenyl group. The aromatic group with fluorine and fluorenyl group is selected from the group consisting of

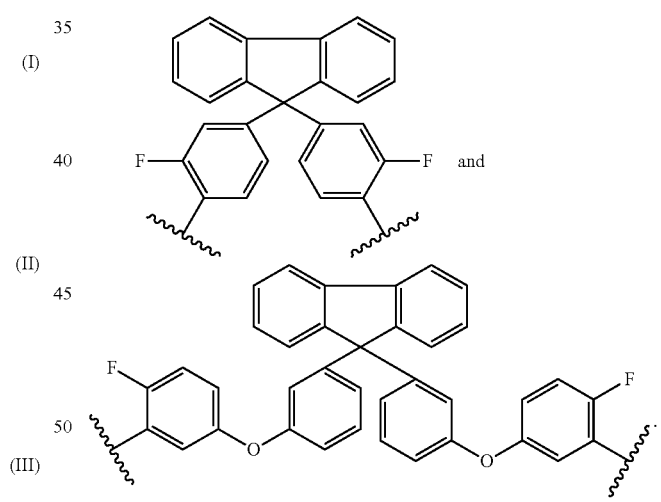

B, B' and B" are aromatic groups different from one another. B, B' and B" are selected from the group consisting of

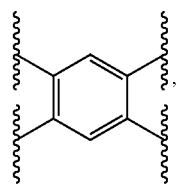

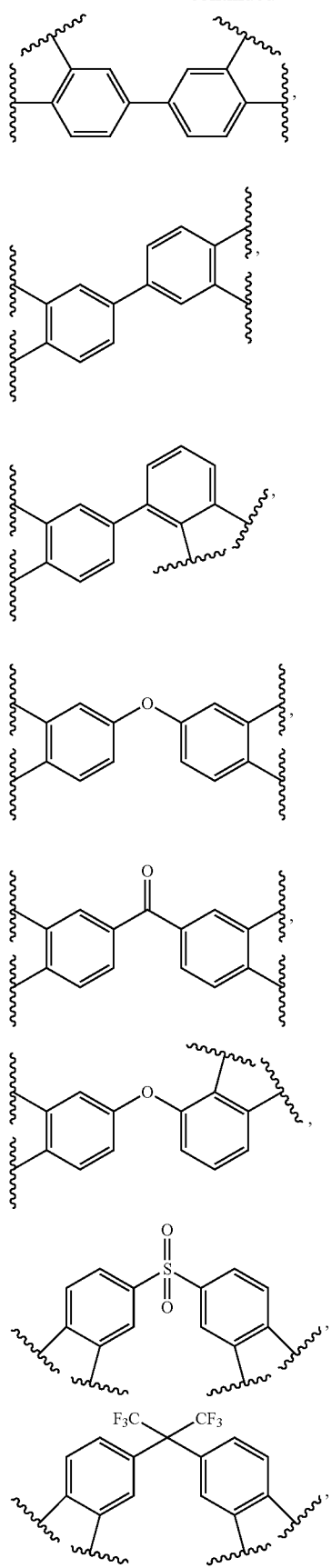
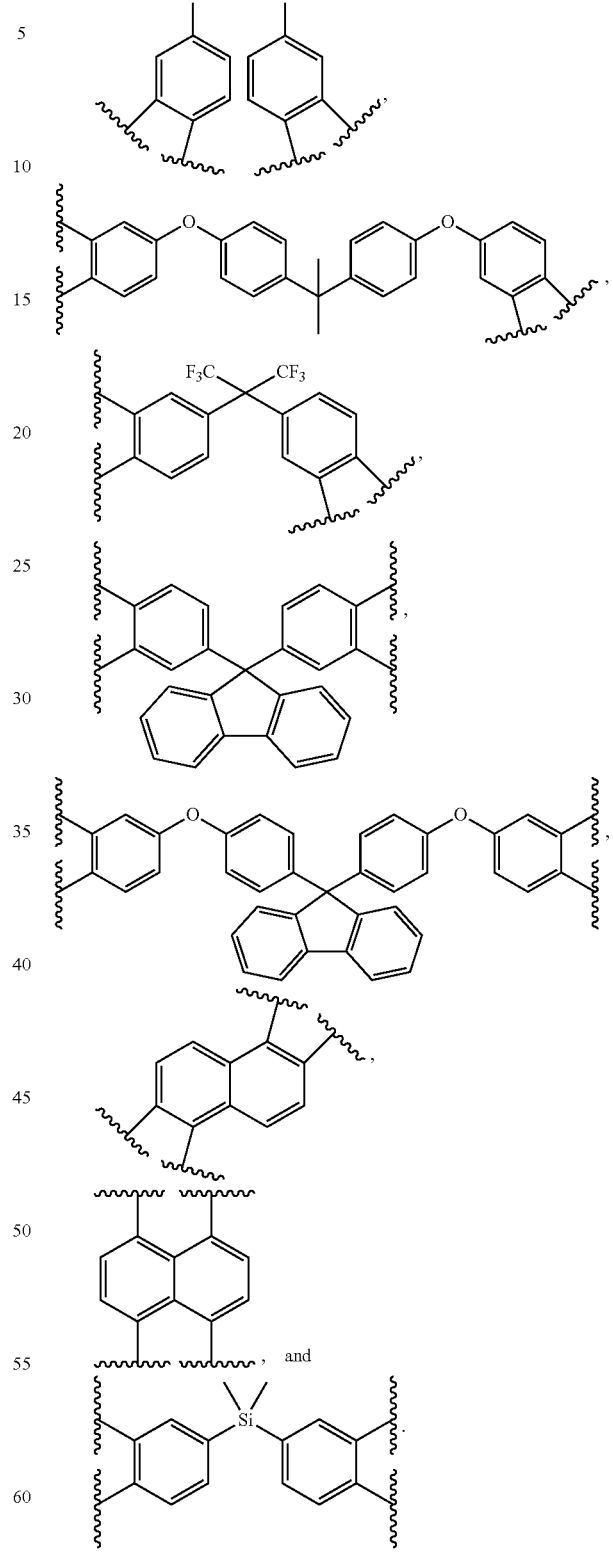
The polyimide polymer satisfies following conditions:
B/(B+B'+B")>0,
B'/(B+B'+B")>0, and
B"/(B+B'+B")>0.

A third embodiment of the disclosure provides a polyimide film with good transmittance, high heat durance and good flexibility. The polyimide film comprises a thin film layer, and the thin film layer comprises the polyimide polymer described above. Therefore, since the polyimide film has good optical transmittance, high heat durance and good flexibility in the disclosure, a substrate can be made from the polyimide film rather than glass.

A fourth embodiment of the disclosure provides a polyimide laminate plate. The polyimide laminate plate comprises at least one thin film layer. The thin film layer is disposed on a metal thin film, and the thin film layer comprises the polyimide polymer described above. Therefore, a flexible printed circuit board can be made from the polyimide laminate plate with high heat durance and good flexibility.

Since the polyimide film in the disclosure is almost colorless and transparent, different kinds of colorants can be blended into the thin film layers so that the polyimide films can show different colors in this and some embodiments of the disclosure. The colorant is selected from the group consisting of titanium dioxide, aluminium oxide, calcium carbonate, calcium sulfate, silicon dioxide, boron nitride, carbon black, ultramarine, copper phthalocyanine and combinations thereof. However, the disclosure is not limited to the colorants. For example, when the polyimide film is used as the cover layer of light emitting diode of light bar, not only the titanium dioxide is added to increase reflectivity, but also some blue colorants are added to adjust the color space of light emitted from a light emitting diode of a light bar.

In some embodiments of the disclosure, some inorganic nanoparticles are blended into the thin film layers so that the heat endurance and optical transmittance of the polyimide film are increased. The inorganic nanoparticles are selected from the group consisting of silicon dioxide, talcum powder, mica, clay, titanium dioxide and combinations thereof. However, the disclosure is not limited to the foregoing examples of the inorganic nanoparticles.

In the embodiment described above, the polyimide polymer is synthesized by a polycondensation reaction involving the reaction of some diamine components and some dianhydride components. The diamine component is selected from a group consisting of 2,2'-Bis(trifluoromethyl)benzidine (TFMB, CAS No. 341-58-2), 2,2-Bis[4-(4-aminophenoxy)phenyl]hexafluoropropane (HFBAPP, CAS No. 69563-88-8), 4,4'-oxybis[3-(trifluoromethyl)benzeneamine] (BTFDPE, CAS No. 344-48-9), 4,4'-[1,4-phenylenebis(oxy)]Bis[3-(trifluoromethyl)]benzenamine (FAPQ, CAS No. 94525-05-0), 9,9-Bis(4-amino-3-fluorophenyl)fluorine (FFDA, CAS No. 127926-65-2), 9,9-Bis[4-(4-amino-3-fluorophenyl)bezene]fluorine and combinations thereof.

The dianhydride component is selected from a group consisting of 1,2,4,5 benzene tetracarboxylic dianhydride, 3,3',4,4'-biphenyl tetracarboxylic dianhydride (BPDA), 3,4,3',4'-biphenyl tetracarboxylic dianhydride, 2,3,3',4'-biphenyl tetracarboxylic dianhydride, 4,4'-oxydiphthalic anhydride, 3,4'-oxydiphthalic anhydride, benzophenonetetracarboxylic dianhydride, 2,2-bis[4-(3,4dicarboxyphenoxy)phenyl] propane dianhydride (BPADA), 2,2-bis(3,4-anhydrodicarboxyphenyl)hexafluoropropane (6FDA), 3,3',4,4'-diphenyl sulfonetetracarboxylic dianhydride, 9,9-bis(3,4-dicarboxyphenyl)fluorene dianhydride (CAS No. 135876-30-1), 9,9-bis[4-(3,4-dicarboxyphenoxt)phenyl]fluorene dianhydride (CAS No. 59507-08-3), 1,2,5, 6-naphthalene tetracarboxylic dianhydride, naphthalenetetracaboxylic dianhydride, bis(3,4-dicarboxyphenyl) dimethylsilane dianhydride, 1,3-bis(4'-phthalic anhydride)-tetramethyldisiloxane and combinations thereof.

The polyimide polymer of the disclosure may be prepared by variety of manufacturing methods with respect to how the components (i.e., the monomers and solvents) are introduced to (e.g., mixed with) one another. In one manufacturing method, first, the diamine components are dissolved in a polar aprotic solvent to form a diamine solution. The polar aprotic solvent, for example, is selected from dimethylformamide (DMF), dimethylacetamide (DMAc), N-methyl-2-pyrrolidone (NMP), hydroxytoluene (Cresol) and gamma-Butyrolactone (γ-butyrolactone or GBL). Next, the dianhydride components are added and mixed with the diamine solution so that the diamine components and the dianhydride components react to form a polyamic acid (PAA). Next, the polyamic acid (PAA) is applied on a support (e.g., belt or drum) and dried to form a thin film. Next, an imidization is performed on the polyamic acid (PAA). Specifically, the process of imidization comprises a cyclic reaction and a dehydration. For example, the cyclic reaction and the dehydration can be performed by heating at 250° C. to 400° C., adding a dehydrating agent (e.g., acid anhydride) or adding a catalyst (e.g., polymer incarcerated catalyst). The cyclic reaction and the dehydration performed by adding the dehydrating agent or the catalyst is called chemical cyclic reaction. Thereby, a polyimide film is formed. The polyamic acid can be applied on a metal thin film directly, and baked to perform imidization to form the polyimide laminate.

In some embodiments, the colorants and/or the inorganic nanoparticles are blended into the diamine components to form a thin film layer with the colorants and/or the inorganic nanoparticles. The followings are the manufacturing process of the thin film layer with the colorants and/or the inorganic nanoparticles. First, the colorants and/or the inorganic nanoparticles are added into the solvent and dispersed by grinding or stirring at the frequency of 20 Hz to 100 Hz to form a suspension solution with the colorants and/or the inorganic nanoparticles. Next, the diamine components are added and dissolved into the suspension solution with the colorants and/or the inorganic nanoparticles. Next, the dianhydride components are added to perform polycondensation reaction with the diamine components in the suspension solution with the colorants and/or the inorganic nanoparticles so that a polyamic acid mixture with viscosity between 10 poises (ps) and 1,000 poises (ps) (i.e., between 1,000 cps and 100,000 cps) is performed. Next, the polyamic acid mixture is dried at a temperature between 120° C. and 200° C. to form a film made by the polyamic acid mixture. At the end, the film made by the polyamic acid mixture is heated at a temperature between 250° C. and 400° C. to perform imidization so that a polyimide polymer in which the colorants and/or the inorganic nanoparticles are blended is formed. The polyamic acid mixture can also be prepared by blending suspension solution of the colorants and/or the inorganic nanoparticles into the polyamic acid prepared by polycondensation of the amine components and the dianhydride components.

The followings are several embodiments of the disclosure and comparative examples described in detail, and the differences of properties between the embodiments and the comparative examples are tested by experiments.

Example 1

First, 2.38 g of 3,3',4,4'-Biphenyltetracarboxylic dianhydride (BPDA, CAS No. 2420-87-3), 4.2 g of 2,2-bis[4-(3, 4dicarboxyphenoxy)phenyl] propane dianhydride (BPADA) and 4.79 g of 4,4'-(Hexafluoroisopropylidene)diphthalic anhydride (6FDA) are mixed in dimethylacetamide (DMAc) to form a DMAc solution with BPDA, BPADA and 6FDA. When BPDA, BPADA and 6FDA are completely dissolved in the DMAc solution, a DMAc solution with 8.63 g of 2,2'-Bis(trifluoromethyl)benzidine (TFMB, CAS No. 341-58-2) dissolved in is added into the DMAc solution with BPDA, BPADA and 6FDA to form a mixture of BPDA, BPADA, 6FDA and TFMB. A molar ratio of BPDA:BPADA:6FDA:TFMB is 0.15:0.15:0.2:0.5. The mixture of BPDA, BPADA, 6FDA and TFMB is stirred for at least 1 hour so that the TFMB is completely reacted to form a polyamic acid (PAA) solution. Then, the PAA solution is applied on the support and dried to form a thin film at 120° C. for 10 minutes. And then, the imidization is performed at 300° C. for 10 minutes for cyclic reaction and dehydration of the polyamic acid (PAA) so that a polyimide film is formed.

Example 1-1

25 g of SiO$_2$ sol-gel (solid content 20%) is added into 100 g of the PAA solution in Example 1 and stirring the solution for at least 1 hour to form a PAA mixture. Wherein, the solid content of the PAA mixture is 20%. Then, the PAA mixture is applied on the support and dried to form a thin film at 120° C. for 10 minutes. And then, the imidization is performed at 300° C. for 10 minutes for cyclic reaction and dehydration of the PAA so that a polyimide film is formed.

Example 2

First, 3.24 g of BPDA, 4.2 g of BPADA and 3.66 g of 6FDA are mixed in DMAc to form a DMAc solution with BPDA, BPADA and 6FDA. When BPDA, BPADA and 6FDA are completely dissolved in the DMAc solution, a DMAc solution with 8.81 g of TFMB dissolved in is added into the DMAC solution with BPDA, BPADA and 6FDA to form a mixture of BPDA, BPADA, 6FDA and TFMB. A molar ratio of BPDA:BPADA:6FDA:TFMB is 0.2:0.15:0.15:0.5. The mixture of BPDA, BPADA, 6FDA and TFMB is stirred for at least 1 hour so that the TFMB is completely reacted to form a polyamic acid (PAA) solution. Then, the PAA solution is applied on the support and dried to form a thin film at 120° C. for 10 minutes. And then, the imidization is performed at 300° C. for 10 minutes for cyclic reaction and dehydration of the PAA so that a polyimide film is formed.

Example 2-1

42.86 g of SiO$_2$ sol-gel (solid content 20%) is added into 100 g of the PAA solution in Example 2 and stirring the solution for at least 1 hour to form a PAA mixture. Wherein, the solid content of the PAA mixture is 20%. Then, the PAA mixture is applied on the support and dried to form a thin film at 120° C. for 10 minutes. And then, the imidization is performed at 300° C. for 10 minutes for cyclic reaction and dehydration of the PAA so that a polyimide film is formed.

Example 2-2

6.6 g of titanium dioxide and 0.2 g of ultramarine are added into 100 g of the PAA solution in Example 2 and stirring the solution for at least 1 hour to form a colored PAA mixture. Then, the colored PAA mixture is applied on the support and dried to form a thin film at 120° C. for 10 minutes. And then, the imidization is performed at 300° C. for 10 minutes for cyclic reaction and dehydration of the PAA so that a polyimide film is formed.

Example 3

First, 3.18 g of BPDA, 4.22 g of BPADA and 3.6 g of 6FDA are mixed in DMAc to form a DMAc solution with BPDA, BPADA and 6FDA. When BPDA, BPADA and 6FDA are completely dissolved in the DMAc solution, a DMAc solution with 6.92 g of TFMB and 2.08 g of 9,9-Bis(4-amino-3-fluorophenyl)fluorine (FFDA, CAS No. 127926-65-2) dissolved in is added into the DMAc solution with BPDA, BPADA and 6FDA to form a mixture of BPDA, BPADA, 6FDA, TFMB and FFDA. A molar ratio of BPDA:BPADA:6FDA:TFMB:FFDA is 0.2:0.15:0.15:0.4:0.1. The mixture of BPDA, BPADA, 6FDA, TFMB and FFDA is stirred for at least 1 hour so that the TFMB and FFDA are completely reacted to form a polyamic acid (PAA) solution. Then, the PAA solution is applied on the support and dried to form a thin film at 120° C. for 10 minutes. And then, the imidization is performed at 300° C. for 10 minutes for cyclic reaction and dehydration of the PAA so that a polyimide film is formed.

Example 3-1

42.86 g of SiO$_2$ sol-gel (solid content 20%) is added into 100 g of the PAA solution in Example 3 and stirring the solution for at least 1 hour to form a PAA mixture. Wherein, the solid content of the PAA mixture is 20%. Then, the PAA mixture is applied on the support and dried to form a thin film at 120° C. for 10 minutes. And then, the imidization is performed at 300° C. for 10 minutes for cyclic reaction and dehydration of the PAA so that a polyimide film is formed.

Example 3-2

6.6 g of titanium dioxide and 0.2 g of ultramarine are added into 100 g of the PAA solution in Example 3 and stirring the solution for at least 1 hour to form a colored PAA mixture. Then, the colored PAA mixture is applied on the support and dried to form a thin film at 120° C. for 10 minutes. And then, the imidization is performed at 300° C. for 10 minutes for cyclic reaction and dehydration of the PAA so that a polyimide film is formed.

Example 4

First, 2.26 g of BPDA, 5.31 g of BPADA and 3.41 g of 6FDA are mixed in DMAc to form a DMAc solution with BPDA, BPADA and 6FDA. When BPDA, BPADA and 6FDA are completely dissolved in the DMAc solution, a DMAc solution with 4.1 g of TFMB and 4.92 g of FFDA dissolved in is added into the DMAc solution with BPDA, BPADA and 6FDA to form a mixture of BPDA, BPADA, 6FDA, TFMB and FFDA. A molar ratio of BPDA:BPADA:6FDA:TFMB:FFDA is 0.15:0.2:0.15:0.25:0.25. The mixture of BPDA, BPADA, 6FDA, TFMB and FFDA is stirred for at least 1 hour so that the TFMB and FFDA are completely reacted to form a polyamic acid (PAA) solution. Then, the PAA solution is applied on the support and dried to form a thin film at 120° C. for 10 minutes. And then, the imidization is performed at 300° C. for 10 minutes for cyclic reaction and dehydration of the PAA so that a polyimide film is formed.

Example 5

First, 2.4 g of BPDA, 2.84 g of BPADA and 6.04 g of 6FDA are mixed in DMAc to form a DMAc solution with BPDA, BPADA and 6FDA. When BPDA, BPADA and 6FDA are completely dissolved in the DMAc solution, a DMAc solution with 4.1 g of TFMB dissolved in is added into the DMAc solution with BPDA, BPADA and 6FDA to form a mixture of BPDA, BPADA, 6FDA and TFMB. A molar ratio of BPDA:BPADA:6FDA:TFMB is 0.15:0.1:0.25:0.5. The mixture of BPDA, BPADA, 6FDA and TFMB is stirred for at least 1 hour so that the TFMB is completely reacted to form a polyamic acid (PAA) solution. Then, the PAA solution is applied on the support and dried to form a thin film at 120° C. for 10 minutes. And then, the imidization is performed at 300° C. for 10 minutes for cyclic reaction and dehydration of the PAA so that a polyimide film is formed.

Example 5-1

42.86 g of $SiO_2$ sol-gel (solid content 20%) is added into 100 g of the PAA solution in Example 5 and stirring the solution for at least 1 hour to form a PAA mixture. Wherein, the solid content of the PAA mixture is 20%. Then, the PAA mixture is applied on the support and dried to form a thin film at 120° C. for 10 minutes. And then, the imidization is performed at 300° C. for 10 minutes for cyclic reaction and dehydration of the PAA so that a polyimide film is formed.

Comparative Example 1

First, 4.04 g of BPDA and 7.16 g of BPADA are mixed in DMAc to form a DMAc solution with BPDA and BPADA. When BPDA and BPADA are completely dissolved in the DMAc solution, a DMAc solution with 8.8 g of TFMB dissolved in is added into the DMAc solution with BPDA and BPADA to form a mixture of BPDA, BPADA and TFMB. A molar ratio of BPDA:BPADA:TFMB is 0.25:0.25:0.5. The mixture of BPDA, BPADA and TFMB is stirred for at least 1 hour so that the TFMB is completely reacted to form a polyamic acid (PAA) solution. Then, the PAA solution is applied on the support and dried to form a thin film at 120° C. for 10 minutes. And then, the imidization is performed at 300° C. for 10 minutes for cyclic reaction and dehydration of the PAA so that a polyimide film is formed.

Comparative Example 1-1

25 g of $SiO_2$ sol-gel (solid content 20%) is added into 100 g of the PAA solution in Comparative example 1 and stirring the solution for at least 1 hour to form a PAA mixture. Wherein, the solid content of the PAA mixture is 20%. Then, the PAA mixture is applied on the support and dried to form a thin film at 120° C. for 10 minutes. And then, the imidization is performed at 300° C. for 10 minutes for cyclic reaction and dehydration of the PAA so that a polyimide film is formed.

Comparative Example 1-2

6.6 g of titanium dioxide and 0.2 g of ultramarine are added into 100 g of the PAA solution in Comparative example 1 and stirring the solution for at least 1 hour to form a colored PAA mixture. Then, the colored PAA mixture is applied on the support and dried to form a thin film at 120° C. for 10 minutes. And then, the imidization is performed at 300° C. for 10 minutes for cyclic reaction and dehydration of the PAA so that a polyimide film is formed.

Comparative Example 2

First, 4.27 g of BPDA and 6.44 g of 6FDA are mixed in DMAc to form a DMAc solution with BPDA and 6FDA. When BPDA and 6FDA are completely dissolved in the DMAc solution, a DMAc solution with 9.29 g of TFMB dissolved in is added into the DMAc solution with BPDA and 6FDA to form a mixture of BPDA, 6FDA and TFMB. A molar ratio of BPDA:6FDA:TFMB is 0.25:0.25:0.5. The mixture of BPDA, 6FDA and TFMB is stirred for at least 1 hour so that the TFMB is completely reacted to form a polyamic acid (PAA) solution. Then, the PAA solution is applied on the support and dried to form a thin film at 120° C. for 10 minutes. And then, the imidization is performed at 300° C. for 10 minutes for cyclic reaction and dehydration of the PAA so that a polyimide film is formed.

Comparative Example 2-1

25 g of $SiO_2$ sol-gel (solid content 20%) is added into 100 g of the PAA solution in Comparative example 2 and stirring the solution for at least 1 hour to form a PAA mixture. Wherein, the solid content of the PAA mixture is 20%. Then, the PAA mixture is applied on the support and dried to form a thin film at 120° C. for 10 minutes. And then, the imidization is performed at 300° C. for 10 minutes for cyclic reaction and dehydration of the PAA so that a polyimide film is formed.

Comparative Example 2-2

6.6 g of titanium dioxide is added into 100 g of the PAA solution in Comparative example 2 and stirring the solution for at least 1 hour to form a colored PAA mixture. Then, the colored PAA mixture is applied on the support and dried to form a thin film at 120° C. for 10 minutes. And then, the imidization is performed at 300° C. for 10 minutes for cyclic reaction and dehydration of the PAA so that a polyimide film is formed.

At last, the polyimide polymers in the examples and the comparative examples above are tested, and the test result are shown in Table 1 to Table 3. Wherein, the test of chemical resistance is that the polyimide polymers of the examples and the comparative examples described above are immersed in N-Methyl-2-pyrrolidone (NMP), dimethylacetamide (DMAc), oxalic acid, the developer and stripper at 50° C. for an hour. The solubility of the thin films in the solvent described above is observed to obtain the chemical resistance of the thin films. The test results represented by "good" means the test results fulfill the requirement as being substrates of display panels and touch panels.

TABLE 1

|  | Film forming | flexibility | Chemical resistance | Transmittance (%) | Glass transition temperature, $T_g$ (° C.) |
| --- | --- | --- | --- | --- | --- |
| Example 1 | good | good | good | 90% | 250 |
| Example 2 | good | good | good | 90% | 250 |
| Example 3 | good | good | good | 90% | 290 |
| Example 4 | good | good | good | 88% | 300 |
| Example 5 | good | good | good | 90% | 280 |

TABLE 1-continued

| | Film forming | flexi-bility | Chemical resistance | Transmittance (%) | Glass transition temperature, $T_g$ (° C.) |
|---|---|---|---|---|---|
| Comparative example 1 | good | good | good | 86% | 190 |
| Comparative example 2 | good | good | good | 90% | 300 |

TABLE 2

| | Film forming | flexi-bility | Chemical resistance | Transmittance (%) | Glass transition temperature, $T_g$ (° C.) |
|---|---|---|---|---|---|
| Example 1-1 | good | good | good | 92% | 270 |
| Example 2-1 | good | good | good | 92% | 290 |
| Example 3-1 | good | good | good | 92% | 310 |
| Example 5-1 | good | good | good | 92% | 300 |
| Comparative example 1-1 | good | good | good | 88% | 220 |
| Comparative example 2-1 | fragile | — | — | — | — |

TABLE 3

| | Film forming | flexi-bility | Chemical resistance | Color stability, Δb* | Glass transition temperature, $T_g$ (° C.) |
|---|---|---|---|---|---|
| Example 2-2 | good | good | good | 1.8 | 250 |
| Example 3-2 | good | good | good | 1.9 | 290 |
| Comparative example 1-2 | good | good | good | 2.2 | 220 |
| Comparative example 2-2 | fragile | — | — | — | — |

According to the polyimide polymer, the polyimide film having the same and the polyimide laminate plate having the same of the embodiments of the disclosure, when the polyimide polymer comprises the first repeat unit represented by formula (I), the second repeat unit represented by formula (II) and the third repeat unit represented by formula (III), and the ratio of the aromatic group with fluorine and fluorenyl group, the aromatic group with fluorine but without fluorenyl group and the aromatic group is in a range described above, the polyimide film formed by polyimide polymer has good transmittance, good flexibility and high heat endurance at the same time. Although the comparative example 2 has good transmittance, good flexibility and high heat endurance, the comparative example 2 becomes fragile when the inorganic nanoparticles are added in the polyimide film to further increase the transmittance and the heat endurance. In contrast, the polyimide polymer of the embodiments of the disclosure maintain good transmittance (i.e., 92%), high heat endurance (i.e., the glass transition temperature is 310° C.), good flexibility and good chemical resistance when the inorganic nanoparticles are added into the polyimide polymer to further increase the optical transmittance and the heat endurance. As a result, the substrates of display panels and touch panels can be made from the polyimide film with good transmittance, high heat durance and good flexibility in the disclosure. In addition, the examples of the disclosure with colorants have better color stability than the comparative example 1-2. Therefore, the color transformation is reduced when panel made of the polyimide polymer in the disclosure are heated in use.

What is claimed is:
1. A polyimide polymer, comprising:
    a first repeat unit represented by formula (I);
    a second repeat unit represented by formula (II); and
    a third repeat unit represented by formula (III);

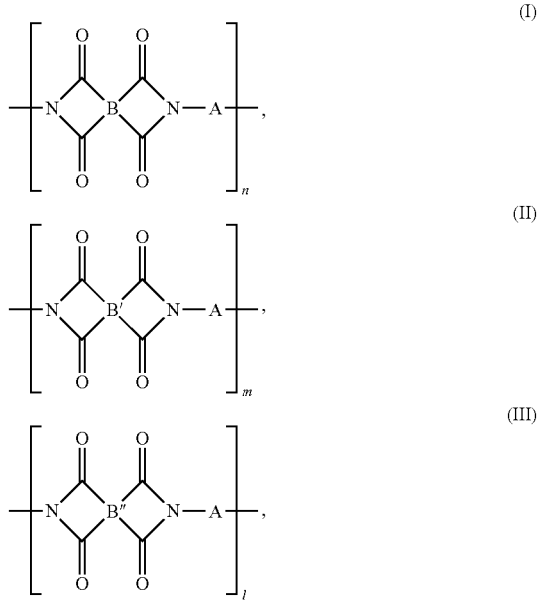

wherein A is aromatic group with fluorine, B, B' and B" are aromatic groups different from one another, and the polyimide polymer satisfies following conditions:

$B/(B+B'+B'')>0;$ $B'/(B+B'+B'')>0;$ and $B''/(B+B'+B'')>0;$ wherein A further comprises A' and A", A' is aromatic group with fluorine but without fluorenyl group, A" is aromatic group with fluorine and fluorenyl group, and a ratio of A':A" is between 1:1 and 9:1.

2. The polyimide polymer of claim 1, wherein a ratio of B:B':B" is 4:3:3 or 3:2:5.

3. The polyimide polymer of claim 1, wherein A' is aromatic group with fluorine but without fluorenyl group selected from the group consisting of

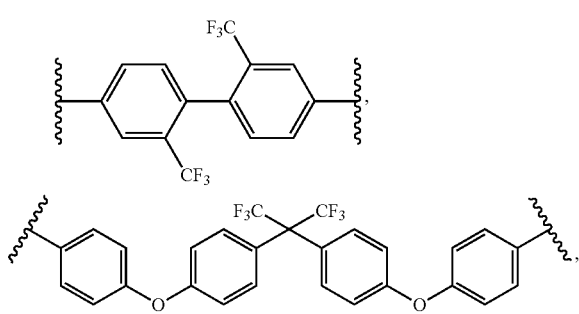

-continued
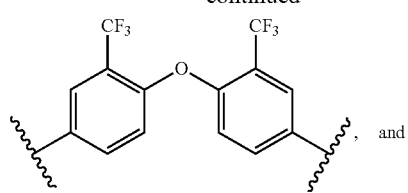
, and
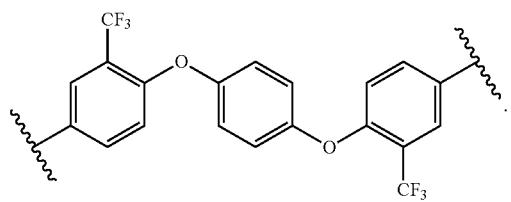
.
4. The polyimide polymer of claim 1, wherein A" is aromatic group with fluorine and fluorenyl group selected from the group consisting of
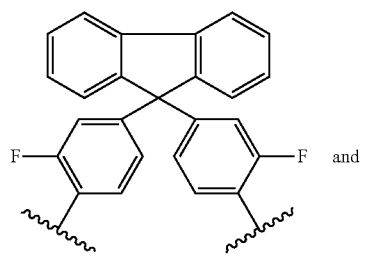
and
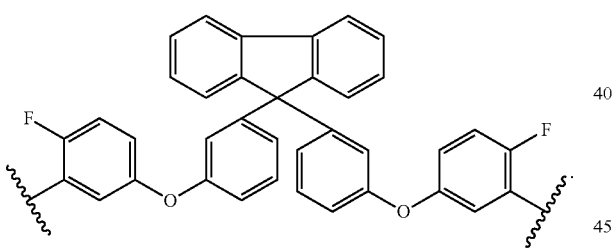
.
5. The polyimide polymer of claim 1, wherein B, B' and B" are aromatic groups selected from the group consisting of
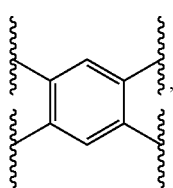
,
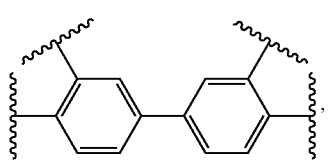
,
-continued
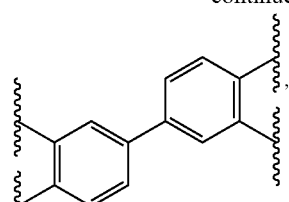
,
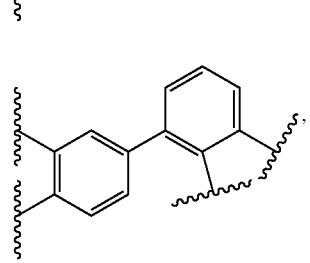
,
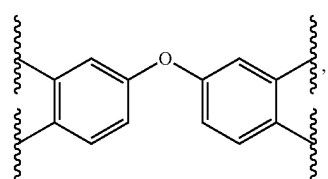
,
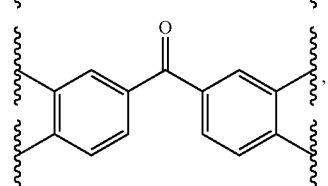
,
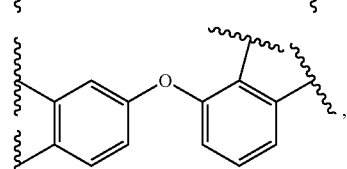
,
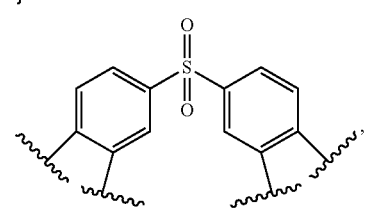
,
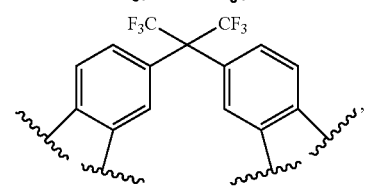
,
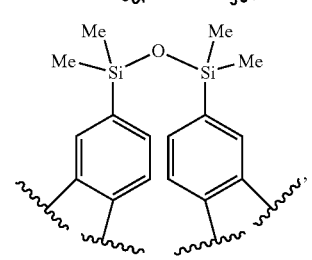
, -continued

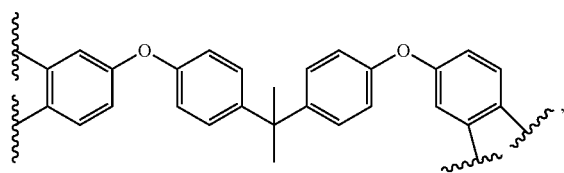

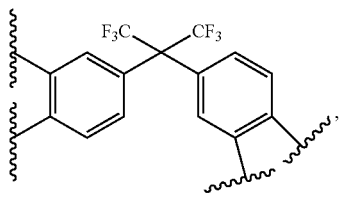

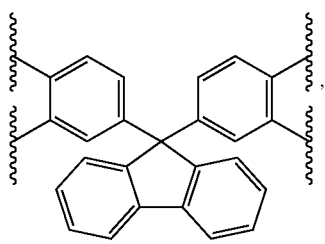

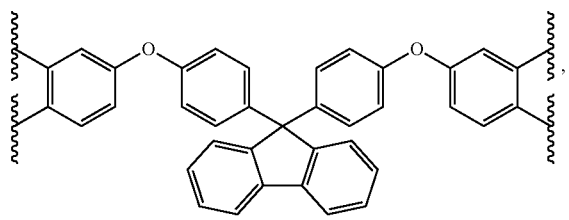

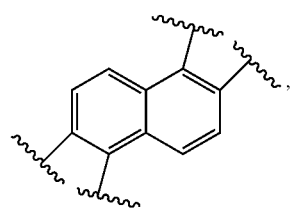

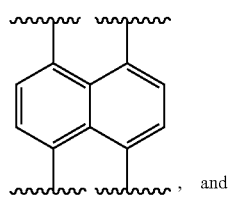, and

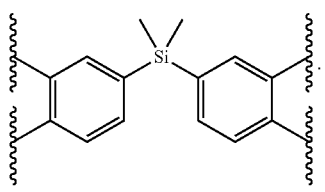.

6. A polyimide film comprising a thin film layer, the thin film layer comprising a polyimide polymer, the polyimide polymer comprising:

a first repeat unit represented by formula (I);
a second repeat unit represented by formula (II); and
a third repeat unit represented by formula (III);

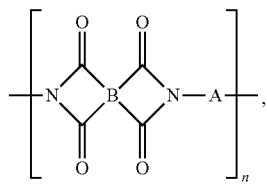 (I)

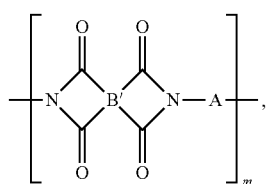 (II)

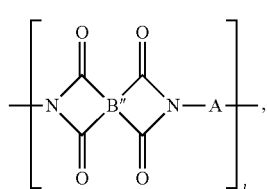 (III)

wherein A is aromatic group with fluorine, B, B' and B" are aromatic groups different from one another, and the polyimide polymer satisfies following conditions:

$B/(B+B'+B'')>0$;

$B'/(B+B'+B'')>0$; and $B''/(B+B'+B'')>0$;

wherein A further comprises A' and A", A' is aromatic group with fluorine but without fluorenyl group, A" is aromatic group with fluorine and fluorenyl group, and a ratio of A':A" is between 1:1 and 9:1.

7. The polyimide film of claim 6, wherein a ratio of B:B':B" is 4:3:3 or 3:2:5.

8. The polyimide film of claim 6, wherein A' is aromatic group with fluorine but without fluorenyl group selected from the group consisting of

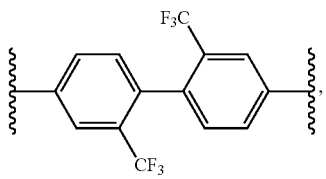,

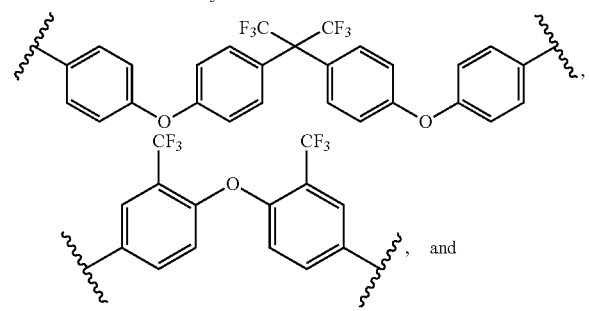, and

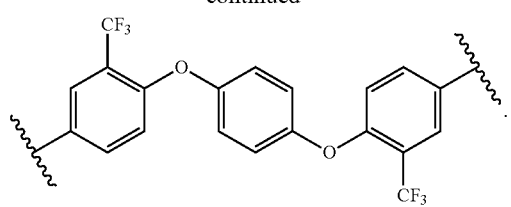
9. The polyimide film of claim 6, wherein A" is aromatic group with fluorine and fluorenyl group selected from the group consisting of
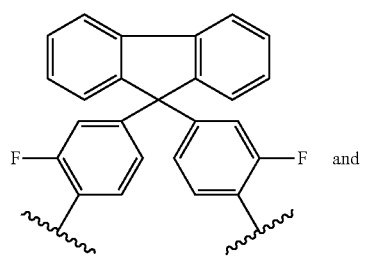 and
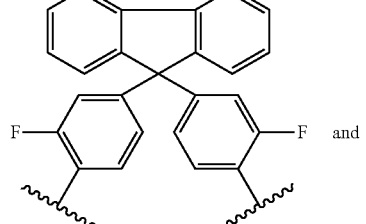
10. The polyimide film of claim 6, wherein B, B' and B" are aromatic groups selected from the group consisting of
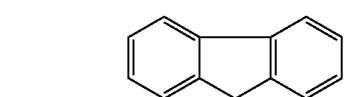,
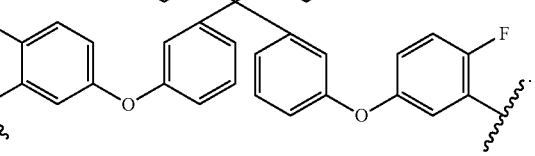,
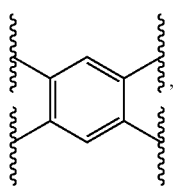,
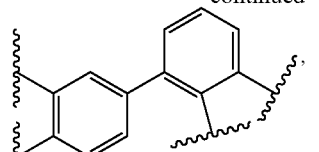,
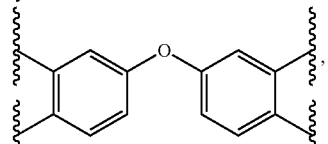,
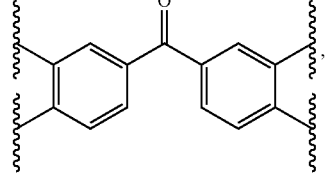,
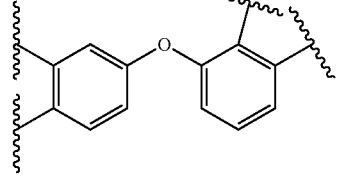,
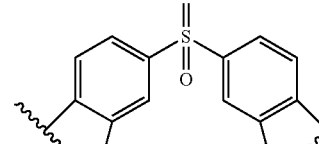,
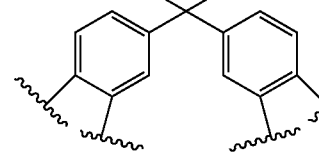,
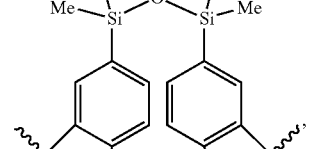,
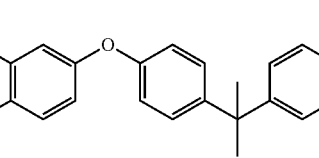,
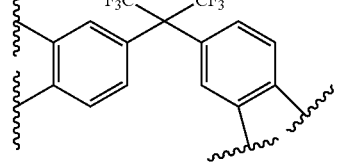, -continued

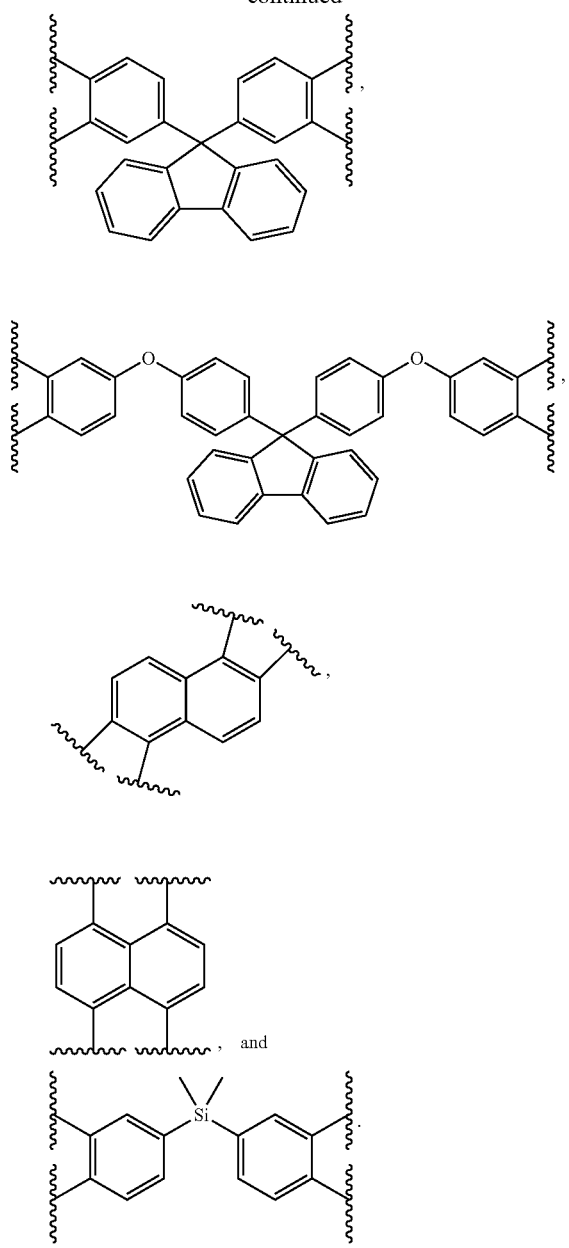

11. The polyimide film of claim 6, further comprising a colorant, the colorant being blended into the thin film layer, and the colorant is selected from the group consisting of titanium dioxide, aluminium oxide, calcium carbonate, calcium sulfate, silicon dioxide, boron nitride, carbon black, ultramarine, copper phthalocyanine and combinations thereof.

12. The polyimide film of claim 6, further comprising an inorganic nanoparticle, the inorganic nanoparticle being blended into the thin film layer, and the inorganic nanoparticle is selected from the group consisting of silicon dioxide, talcum powder, mica, clay, titanium dioxide and combinations thereof.

13. A polyimide laminate plate comprising a thin film layer, the thin film layer comprising a polyimide polymer, the polyimide polymer comprising:

a first repeat unit represented by formula (I);
a second repeat unit represented by formula (II); and
a third repeat unit represented by formula (III);

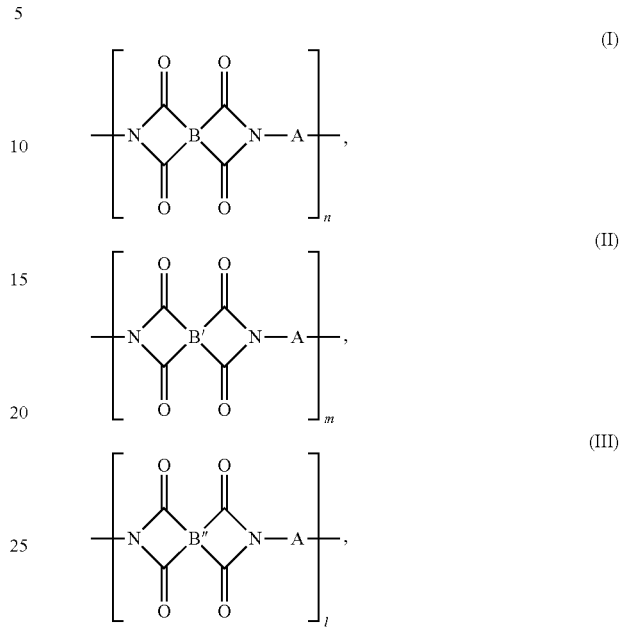

wherein A is aromatic group with fluorine, B, B' and B" are aromatic groups different from one another, and the polyimide polymer satisfies following conditions:

$B/(B+B'+B'')>0$;

$B'/(B+B'+B'')>0$; and $B''/(B+B'+B'')>0$;

wherein A further comprises A' and A", A' is aromatic group with fluorine but without fluorenyl group, A" is aromatic group with fluorine and fluorenyl group, and a ratio of A':A" is between 1:1 and 9:1.

14. The polyimide laminate plate of claim 13, wherein a ratio of B:B':B" is 4:3:3 or 3:2:5.

15. The polyimide laminate plate of claim 13, wherein A' is aromatic group with fluorine but without fluorenyl group selected from the group consisting of

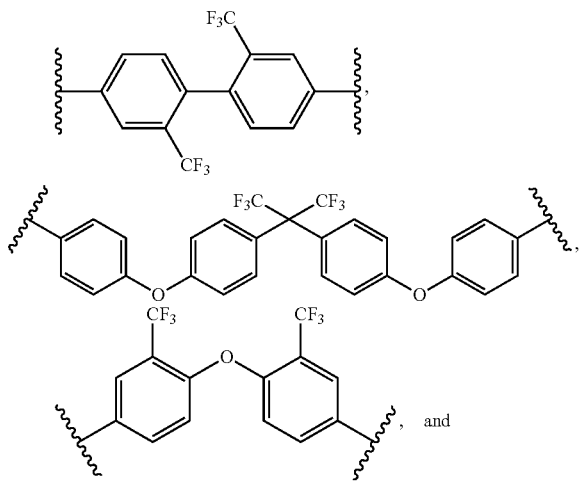

-continued
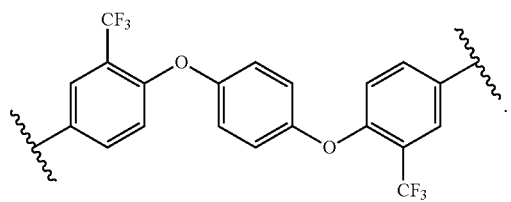
16. The polyimide laminate plate of claim 13, wherein A" is aromatic group with fluorine and fluorenyl group selected from the group consisting of
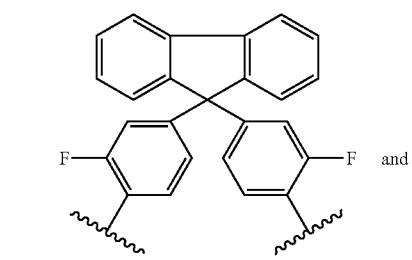 and
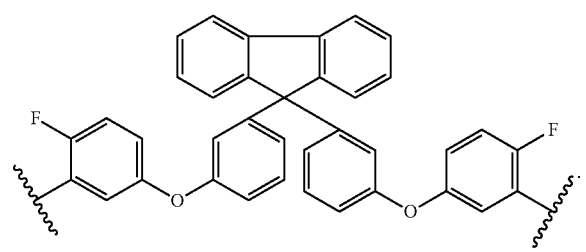
17. The polyimide laminate plate of claim 13, wherein B, B' and B" are aromatic groups selected from the group consisting of
-continued
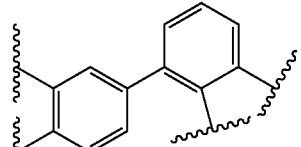,
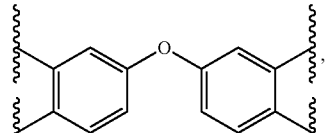,
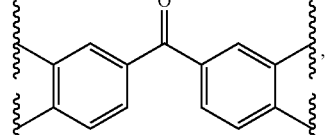,
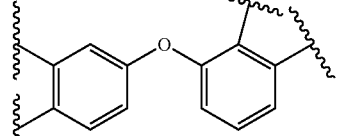,
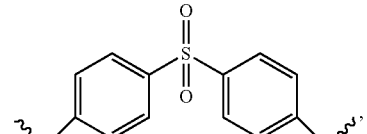,
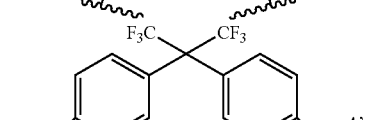,
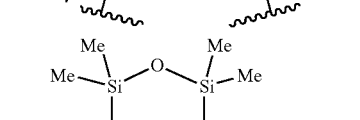,
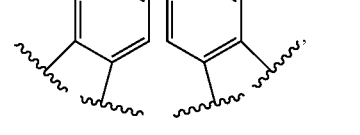,
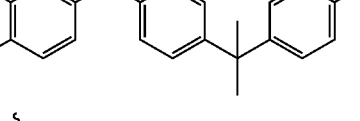,
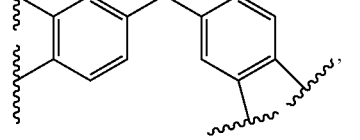,

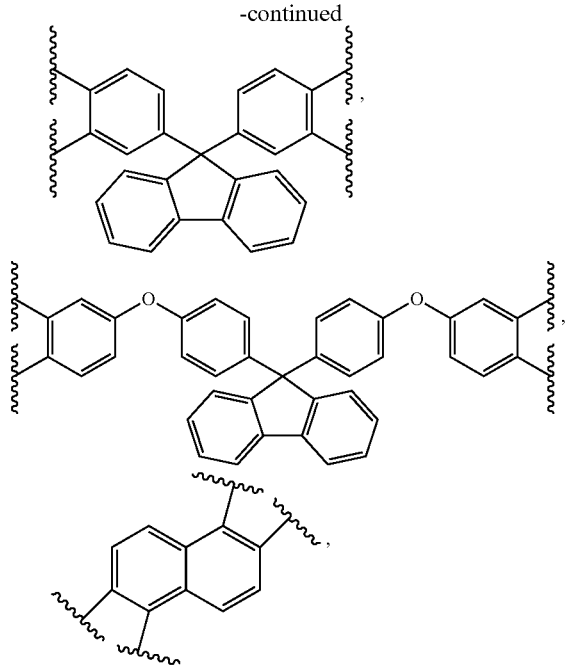
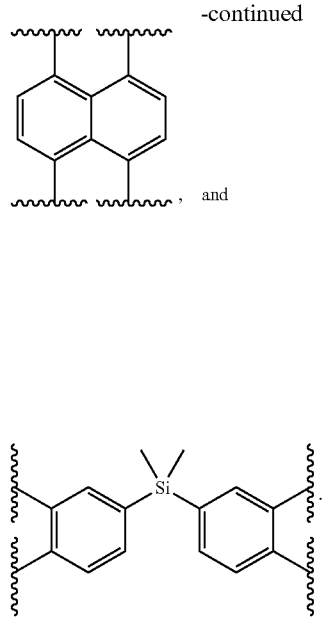
* * * * *